United States Patent
Ngo et al.

(10) Patent No.: US 6,891,399 B2
(45) Date of Patent: May 10, 2005

(54) VARIABLE PULSE WIDTH AND PULSE SEPARATION CLOCK GENERATOR

(75) Inventors: Hung Cai Ngo, Austin, TX (US); Wendy Ann Belluomini, Austin, TX (US); Robert Kevin Montoye, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/388,977

(22) Filed: Mar. 13, 2003

(65) Prior Publication Data

US 2004/0178838 A1 Sep. 16, 2004

(51) Int. Cl.[7] .......................... H03K 19/00; H03K 3/00; H03H 11/26; G06F 1/04
(52) U.S. Cl. .......................... 326/93; 327/263; 327/291
(58) Field of Search .............................. 326/93, 95, 98; 327/141, 175, 263, 291; 365/233; 370/518; 375/375; 713/400, 401, 500, 501

(56) References Cited

U.S. PATENT DOCUMENTS

| | | | | |
|---|---|---|---|---|
| 5,008,563 A | * | 4/1991 | Kenney et al. | 327/176 |
| 5,221,863 A | * | 6/1993 | Motegi | 327/157 |
| 5,708,381 A | * | 1/1998 | Higashisaka | 327/276 |
| 5,712,884 A | * | 1/1998 | Jeong | 375/375 |
| 5,740,410 A | * | 4/1998 | McDermott | 713/501 |
| 5,805,923 A | * | 9/1998 | Shay | 710/8 |
| 5,861,769 A | * | 1/1999 | Black | 327/264 |
| 5,926,053 A | * | 7/1999 | McDermott et al. | 327/298 |
| 5,929,682 A | * | 7/1999 | Kazuya et al. | 327/291 |
| 6,067,411 A | * | 5/2000 | Poimboeuf et al. | 713/400 |
| 6,134,182 A | * | 10/2000 | Pilo et al. | 365/233 |
| 6,157,226 A | * | 12/2000 | Ishimi | 327/116 |
| 6,259,283 B1 | * | 7/2001 | Nguyen | 327/122 |
| 6,275,446 B1 | * | 8/2001 | Abedifard | 365/233 |
| 6,282,210 B1 | * | 8/2001 | Rapport et al. | 370/518 |
| 6,285,226 B1 | * | 9/2001 | Nguyen | 327/175 |
| 6,359,481 B1 | * | 3/2002 | Kim | 327/141 |
| 6,445,644 B2 | * | 9/2002 | Sher | 365/233 |
| 6,650,145 B2 | * | 11/2003 | Ngo et al. | 326/98 |
| 6,690,204 B1 | * | 2/2004 | Belluomini et al. | 326/95 |
| 6,798,266 B1 | * | 9/2004 | Vu et al. | 327/291 |

OTHER PUBLICATIONS

*Circuits and Systems for Limited Switch Dynamic Logic*, having U.S. Appl. No. 10/116,612 and filed Apr. 4, 2002.
*A Limited Switch Dynamic Logic Circuit*, having U.S. Appl. No. 10/242,214 and filed Sep. 12, 2002.
*Limited Switch Dynamic Selector Circuits*, having U.S. Appl. No. 10/242,236 and filed Sep. 12, 2002.

* cited by examiner

*Primary Examiner*—Patrick Wamsley
(74) *Attorney, Agent, or Firm*—Volel Emile; Casimer K. Salys

(57) ABSTRACT

A clock pulse generator for generating at least two clocked pulse signals from a global clock signal is provided. The clock pulse generator includes at least one input for receiving a clock signal having a rising and a falling edge and a mechanism for selectably delaying a rising edge of a pulse signal synchronized to the falling edge of the clock signal. The clock pulse generator further includes a first selectable duration pulse synchronized to the rising edge of the clock signal and a second selectable duration pulse synchronized to the selectably delayed rising edge. The clock pulse generator also includes a glitch avoidance circuit to remove glitches in the clock signal before it is used.

9 Claims, 8 Drawing Sheets

VARIABLE PULSE WIDTH AND PULSE SEPARATION CLOCK GENERATOR

CROSS-REFERENCE TO RELATED APPLICATIONS

The present invention is related to the following U.S. Patent Applications which are incorporated by reference.

Ser. No. 10/116,612, filed Apr. 4, 2002, entitled, CIRCUITS AND SYSTEMS FOR LIMITED SWITCH DYNAMIC LOGIC, issued as U.S. Pat. No. 6,650,145;

Ser. No. 10/242,214, filed Sep. 12, 2002, entitled, A LIMITED SWITCH DYNANIC LOGIC CIRCUIT, issued as U.S. Pat. No. 6,690,204; and Ser. No. 10/242,236, filed Sep. 12, 2002, entitled, LIMITED SWITCH DYNAMIC SELECTOR CIRCUITS.

BACKGROUND OF THE INVENTION

1. Technical Field

The present invention is generally directed to clock signals. More specifically, the present invention is directed to a variable pulse width and pulse separation clock generator.

2. Description of Related Art

Dynamic logic is extensively being used in designing high-speed complementary metal oxide semi-conductor (CMOS) circuits. Dynamic logic circuits are clocked circuits. Specifically, a dynamic logic circuit is a structure that includes an output node, a number of NMOS devices and at least one PMOS device. The PMOS device has its gate coupled to a clock for receiving a clock signal, its source coupled to a high voltage Vcc and its drain coupled to a dynamic node. When the clock signal is low, the PMOS device is turned on and the dynamic node is pre-charged to the high voltage Vcc.

In certain dynamic logic circuits (e.g., OR-gates), each NMOS device may have its source coupled to ground or to a low voltage Vss, its drain coupled to the dynamic node and its gate enabled to receive an input signal. Thus, the NMOS devices may conditionally discharge the dynamic node to the low voltage Vss based upon one or all of the input signals.

The dynamic logic circuit is only evaluated when the clock signal is high. That is, when the clock signal is high, the inverse of the voltage value (e.g., Vcc or Vss) on the dynamic node is the output of the circuit. Note that low signal or Vss is used to mean a logical zero (0) and high signal or Vcc is used to mean a logical one (1). Thus, dynamic logic circuits require some sort of a clocking mechanism in order to evaluate and transfer data.

FIG. 1 depicts a representative three-input OR-gate implemented using dynamic logic circuit technology. The circuit contains two PMOS devices (devices 112 and 114) and four NMOS devices (devices 102, 104, 106 and 108) and an inverter 110. PMOS device 112 is used as the pre-charging device and PMOS device 114 is used to maintain the voltage on dynamic node 116. For example, when the clock signal is low, PMOS device 112 will be turned on and thus will pre-charge the dynamic node 116 to Vcc. At line out 120, the voltage will be low due to inverter 110. This low voltage will turn the PMOS device 114 on, which will maintain the voltage on the dynamic node 116 at Vcc.

When the clock signal is high, NMOS device 108 will be turned on and PMOS device 112 will be turned off. If at that time one of the signals received at inputs a, b and c is high, the NMOS device that receives the signal will be turned on. Hence, the dynamic node will be discharged to Vss. At the line out 120, a high voltage will appear.

Early generations of dynamic logic circuits used a clock with a 50% duty cycle or pulse width. That is, 50% of the clock cycle was used as the evaluation phase where an operation would be performed and the other 50% of the clock cycle was used as a pre-charge phase. Consequently, only one operation was performed during each clock cycle. As faster and faster computing systems are designed, higher clock frequencies have become not only desirable, but required. Hence, various methods have been employed to increase frequencies of clock cycles.

One such method is to alter the duty cycle of the clock signal to either increase the evaluate phase and/or decrease the pre-charge phase while maintaining the smallest possible clock period. In this case, the maximum allowable frequency is limited to the setup and hold time requirements of the individual physical components that make up the dynamic digital logic circuit.

Another method that has been used in lieu of or in conjunction with the method described above is pipelining. In a simple pipeline configuration, a dual phase clock scheme is used. The dual phase clock includes generating a differential pair of symmetric clocks. Logic circuitries for implementing operations are divided into specific pipeline stages, whereby each stage uses one of the two clock phases. Specifically, when a pipeline stage performs an operation during an evaluate phase, the subsequent pipeline stage, which may depend on the output from the previous stage, is in its pre-charge phase. This simple pipelining configuration was disclosed in the related Patent Applications cited above.

In any event, since the duty cycle of a clock signal used to drive a dynamic logic circuit depends on the logic combination implemented in the circuit, different circuits may use different duty cycled clock signals. Hence, when a computing system consisting of a plurality of dynamic logic circuits is designed, different duty cycled clock signals may be used. This, then, will require clock signals of different pulse widths and/or separations to be correspondingly designed.

What is needed, therefore, is a variable pulse width and pulse separation generator.

SUMMARY OF THE INVENTION

The present invention provides a clock pulse generator for generating at least two clocked pulse signals from a global clock signal. The clock pulse generator includes at least one input for receiving a clock signal having a rising and a falling edge and a mechanism for selectably delaying a rising edge of a pulse signal synchronized to the falling edge of the clock signal. The clock pulse generator further includes a first selectable duration pulse synchronized to the rising edge of the clock signal and a second selectable duration pulse synchronized to the selectably delayed rising edge. The clock pulse generator also includes a glitch avoidance circuit to remove glitches in the clock signal before it is used.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENTS

Some conventional dynamic logic circuits may have their line out cycle through different logic states as the clock signal driving the circuits cycles through pre-charge and evaluate phases, even if values of Boolean operations being performed by the circuits do not change. That is, even if at each succeeding evaluate phase the output logic states on the output lines of those circuits remain the same, the output lines may nonetheless be transitioning to a different output state during each pre-charge phase.

Figure 1:
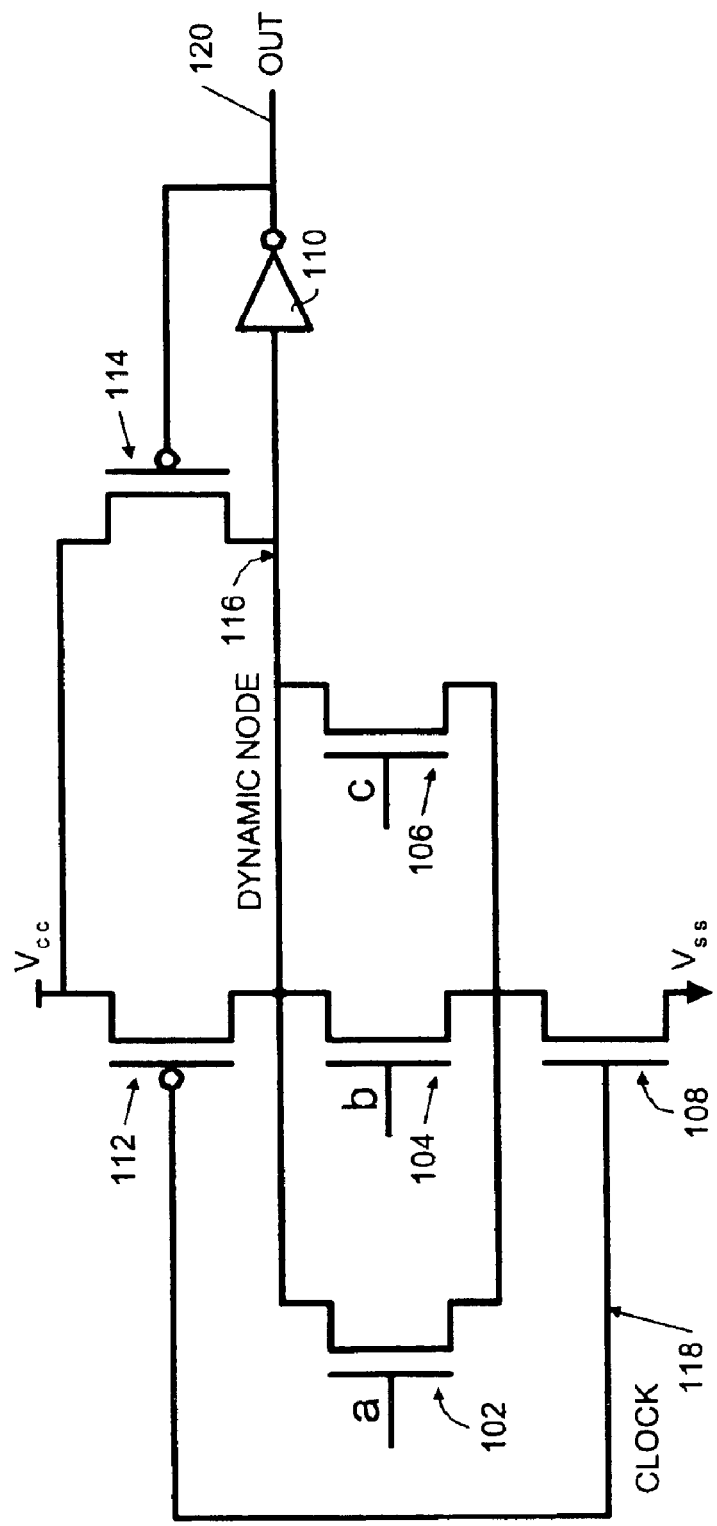
FIG. 1 depicts a representative three-input OR-gate implemented dynamic logic circuit technology.

For example, suppose any one of inputs "a", "b" and "c" of the OR-gate shown in FIG. 1 is a constant logical one (1) during two or more clock periods. Then, at each succeeding evaluate phase, there will be a logical one (1) at line out 120. However, during each pre-charge phase, the line out 120 will transition to a logical zero (0).

Figure 2:
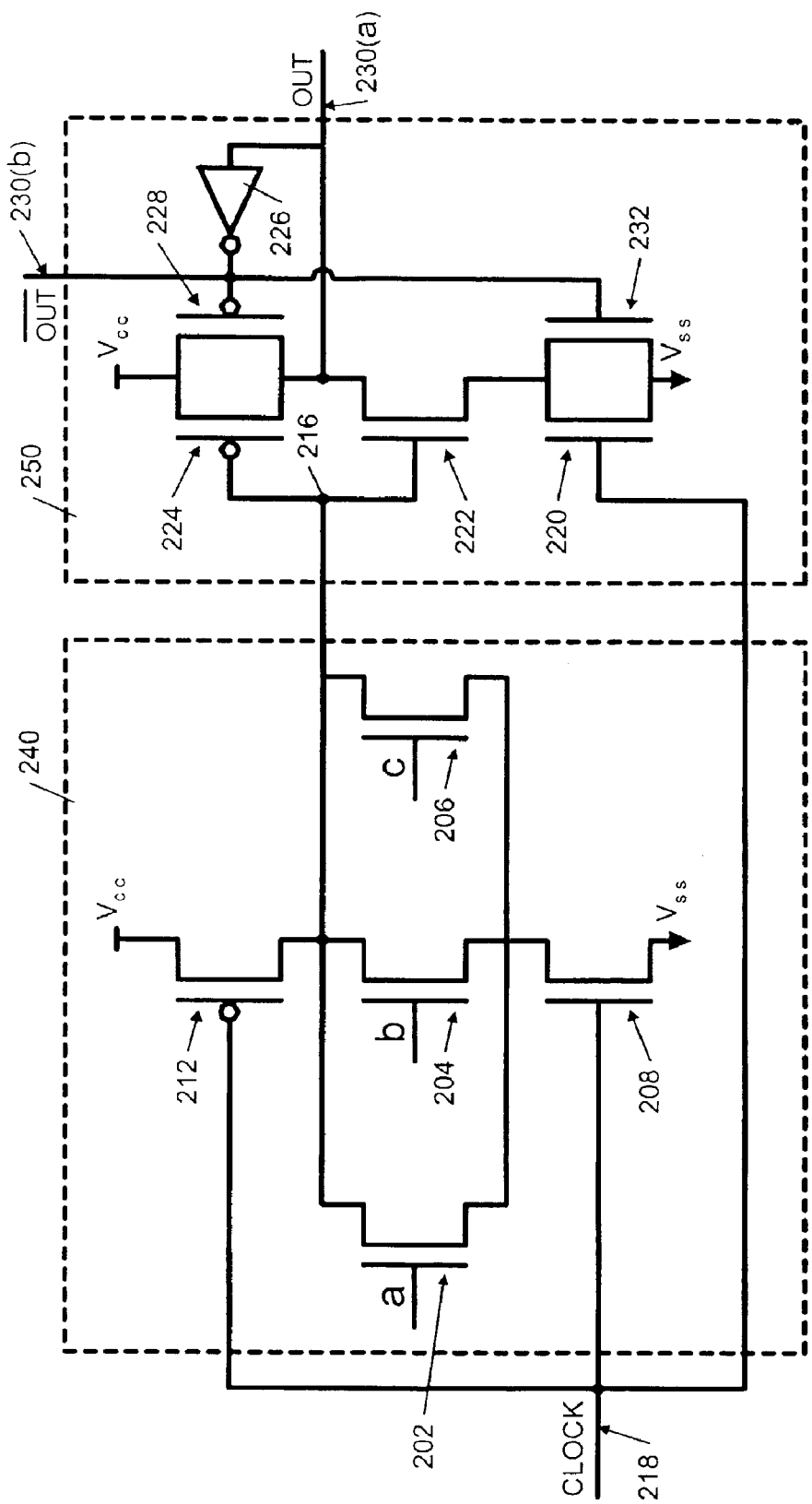
FIG. 2 depicts a three-input limited switch dynamic logic (LSDL) OR-gate circuit.

FIG. 2 depicts a three-input limited switch dynamic logic (LSDL) OR-gate circuit. The LSDL circuit is made of two portions, a dynamic portion 240 and a static portion 250. The dynamic portion 240 contains logic devices 202, 204, 206, 208 and 212. Logic devices 202, 204, 206, 208 and 212 perform the same functions as logic devices 102, 104, 106, 108 and 112, respectively, of FIG. 1. That is, when signal clock at input 218 is low, the NMOS device 208 will be off and PMOS device 212 will be on, pre-charging dynamic node 216 to Vcc. When the clock signal 218 is high, NMOS device 208 will be on. If at that time, any one of the input signals "a", "b" and "c" becomes high, the dynamic node will be discharged to Vss.

Static portion 250 contains logic devices 220, 222, 224, 226, 228 and 232. PMOS device 224 and NMOS device 222 are used as an inverter. Specifically, when the dynamic node 216 is charged to Vcc, PMOS device is turned off and NMOS device is turned on. If the clock signal is high, NMOS device 220 will be turned on and generate the inverse of the voltage level on dynamic node 216 on line out 230(a). Conversely, when the dynamic node 216 is at Vss, the PMOS device 224 will be on and the NMOS device 222 will be off. Hence, the line out 230 will be charged to Vcc.

When line out 230(a) is at Vcc, line out 230(b) is at Vss, NMOS device 232 is off and PMOS device 228 is turned on by virtue of inverter 226. Line out 230(a) is therefore maintained at Vcc. When line out 230(a) is at Vss, line out 230(b) is at Vcc, NMOS device 232 is on and PMOS device 228 is off. When line out 230(a) is at Vss both NMOS 222 and 232 are on.

Devices 220 and 232 and their related connections in static portion 250 are used to ensure that so long as a Boolean operation being performed by the circuit does not change, the output logic state on the output line 230(a) and 230(b) remain constant as the clock signal cycles through pre-charge and evaluate phases. For example, suppose again that any of inputs "a", "b" and "c" is a constant logical one (1) during two or more clock periods. Then, at each succeeding evaluate phase, there will be a logical one (1) at line out 230(a) and a logical zero (0) at line out 230(b). Since both NMOS devices 220 and 232 are off during each pre-charge phase, the line out 230(a) will remain at a logical one (1) and line out 230(b) at a logical zero (0). Thus, the output does not cycle with each pre-charge phase.

As is well known in the art, to cycle through different states, a digital logic circuit has to consume energy. Hence, an LSDL circuit may be said to be more energy efficient than an equivalent conventional dynamic logic circuit. Note that the logical circuits depicted in both FIGS. 1 and 2 are disclosed in the related Patent applications.

The present invention will be explained using LSDL circuits. However, it should be obvious to anyone skilled in the art that the invention may be used in conjunction with many other types of dynamic logic circuits. Hence, the invention is not restricted to being used with only LSDL circuits.

Figure 3:
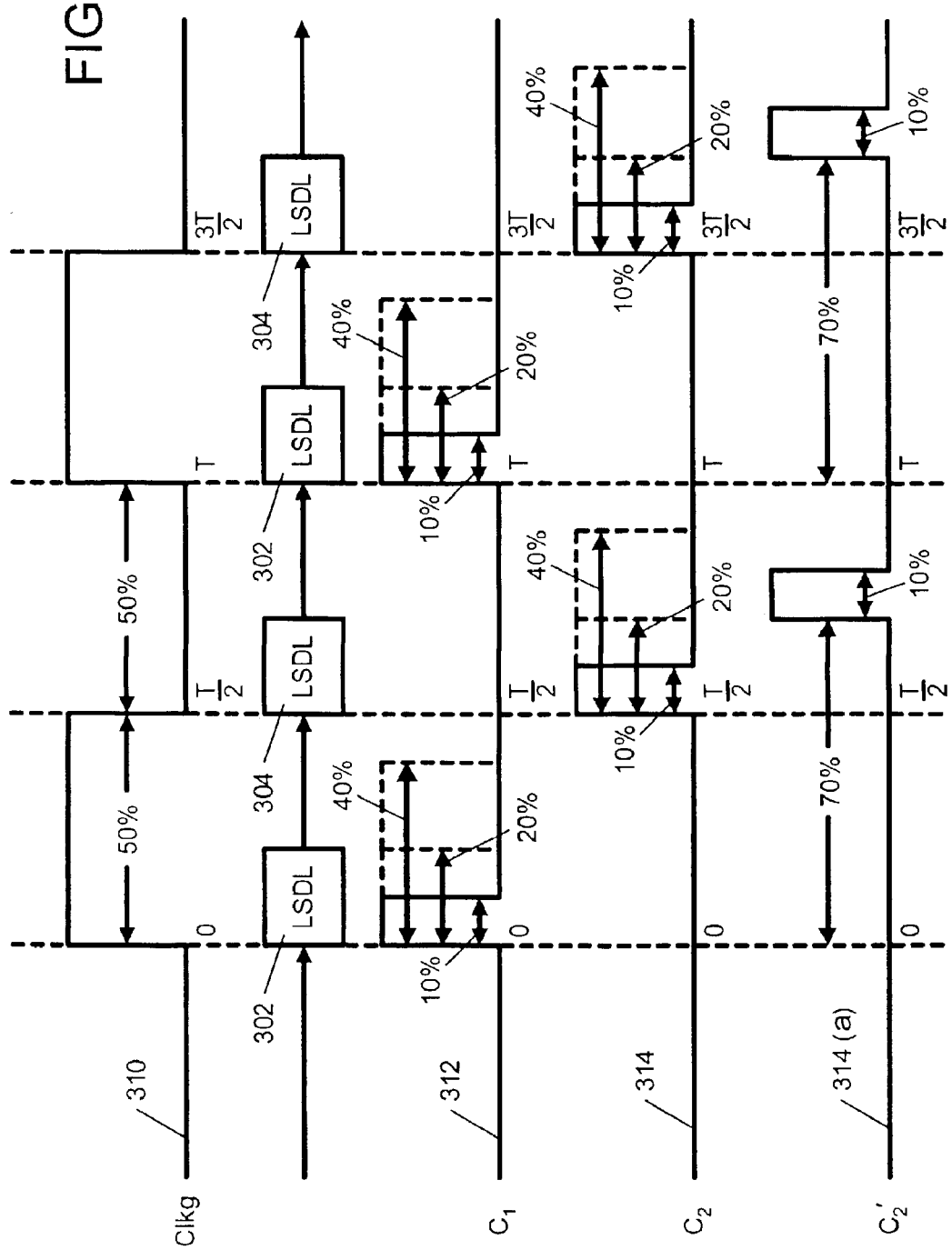
FIG. 3 depicts a global clock signal clkg, clock signals $C_1$ and $C_2$ and a portion of a data processing system implemented using a simple pipeline configuration.

FIG. 3 depicts a global clock signal clkg 310, clock signals $C_1$ 312, $C_2$ 314 and $C_2'$ 314(a) and a portion of a data processing system implemented using the simple pipeline configuration disclosed earlier. The portion of the data processing system includes LSDL circuits 302 and 304 arranged in alternating cascaded succession. The global clock signal clkg 310 is shown having a pulse width of half a period T (i.e., T/2 or 50%). The clock signals $C_1$ 312 and $C_2$ 314, on the other hand, are shown having a pulse width of 10% of the period T. As will be explained later, both clock signals $C_1$ 312 and $C_2$ 314 are derived from the global clock signal clkg 310. Specifically, the pulse of clock signal $C_1$ will be shown to be triggered on the rising edge of the duty cycle of the global clock signal clkg 310 and that of the clock signal $C_2$ on the falling edge of the duty cycle.

The clock signal $C_1$ 312 is used to drive LSDL circuits 302 and the clock signal $C_2$ 314 is used to drive LSDL circuits 304. Hence, the portion of the data processing system using LSDL circuits 302 and 304 are implemented using a two-phase clock signal.

As mentioned earlier, the setup and hold time requirements of individual physical components that make up a dynamic digital logic circuit (or LSDL circuit in this case) dictate the duty cycle of the clock signal that is to be used to drive the circuit. Hence, if instead of 10%, 20% or 40% etc. of the period of the global clock clkg 310 is needed to satisfy the setup and hold time requirements of the logic functions or physical components in the successive LSDL circuits 302 and 304, then pulse widths of 20% or 40% etc. of the period T, respectively, should be used. In accordance with the present invention, therefore, clock signals $C_1$ 312 and $C_2$ 314 are shown to have selectively adjustable pulse widths of 10%, 20% and 40% of the period T.

Further, suppose the LSDL circuits 304 use data from the LSDL circuits 302 and both circuits only require an evaluation phase clock signal of 10% of the period T to function properly. Suppose, in addition, that due to interconnection delays brought by loads, device mismatches, temperatures, voltage gradients etc., between the LSDL circuits 302 and 304, it takes a time equal to 70% of the period T for data from the LSDL circuits 302 to travel to the LSDL circuits 304. Then, having the LSDL circuits 304 use an evaluation cycle starting at time T/2 will yield erroneous data in that the data from 302 will arrive at 304 after the evaluation phase has concluded. In cases such as this, the LSDL circuits 304 should be evaluated at time intervals beginning at 70% of the period T. Clock signal $C_2$ 314(a) is shown having this additional 20% delay beyond the T/2 falling edge at the 50% duty cycle point. This clock signal would then be suitable to drive the LSDL circuits 304 of this example.

Note that the adjustable pulse widths of 10%, 20% and 40% of the period T as well as pulse trigger points of 0, 50% and 70% of the period T are used for illustrative purposes only. Therefore, the present invention is not thus restricted. Pulse widths of any length and separation may be used and are within the scope and spirit of the invention.

Figure 4:
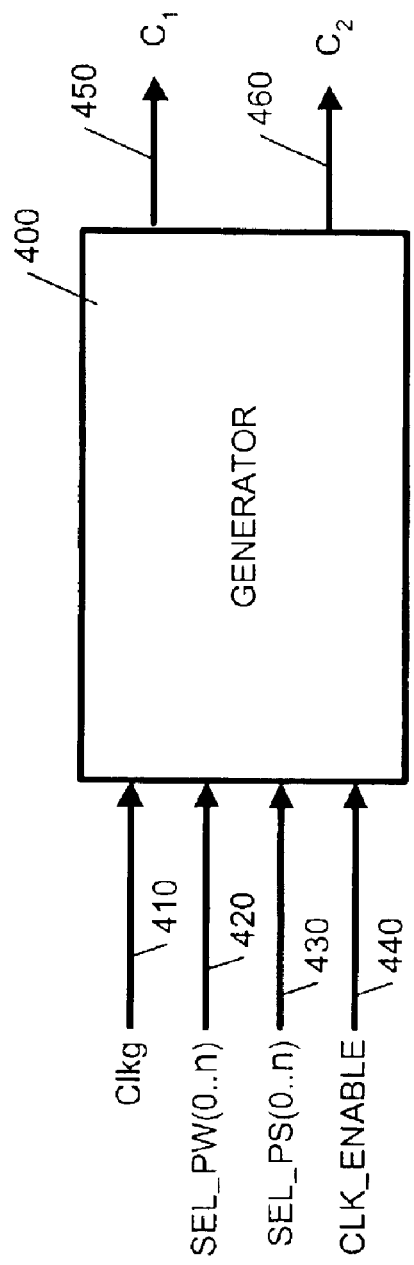
FIG. 4 is a block diagram of a variable pulse width and pulse separation clock generator of the present invention.

FIG. 4 is a block diagram of a variable pulse width and pulse separation clock generator 400 of the present invention. The variable pulse width and pulse separation clock generator 400 has four inputs and two outputs. The four inputs include a global clock signal input 410, a pulse width selection input 420, a pulse separation input 430 and a clock enable input 440. The two outputs include clock signals $C_1$ 450 and $C_2$ 460. The pulse width selection input 420 may receive one or a plurality of signals (i.e., SEL_PW(0 . . . n)). Likewise, the pulse separation selection input 430 may receive one or a plurality of signals (i.e., SEL_PS(0 . . . n)).

According to the invention, output clock signals $C_1$ 450 and $C_2$ 460 will have a pulse width based on the pulse width signal transmitted to the generator 400. Further, the separation between the pulses of output clock signals $C_1$ 450 and $C_2$ 460 will depend on the pulse separation signal transmitted to the generator 400. As will be explained later, clock enable signal clk_enable is used to drive a glitch avoidance circuit.

Figure 5:
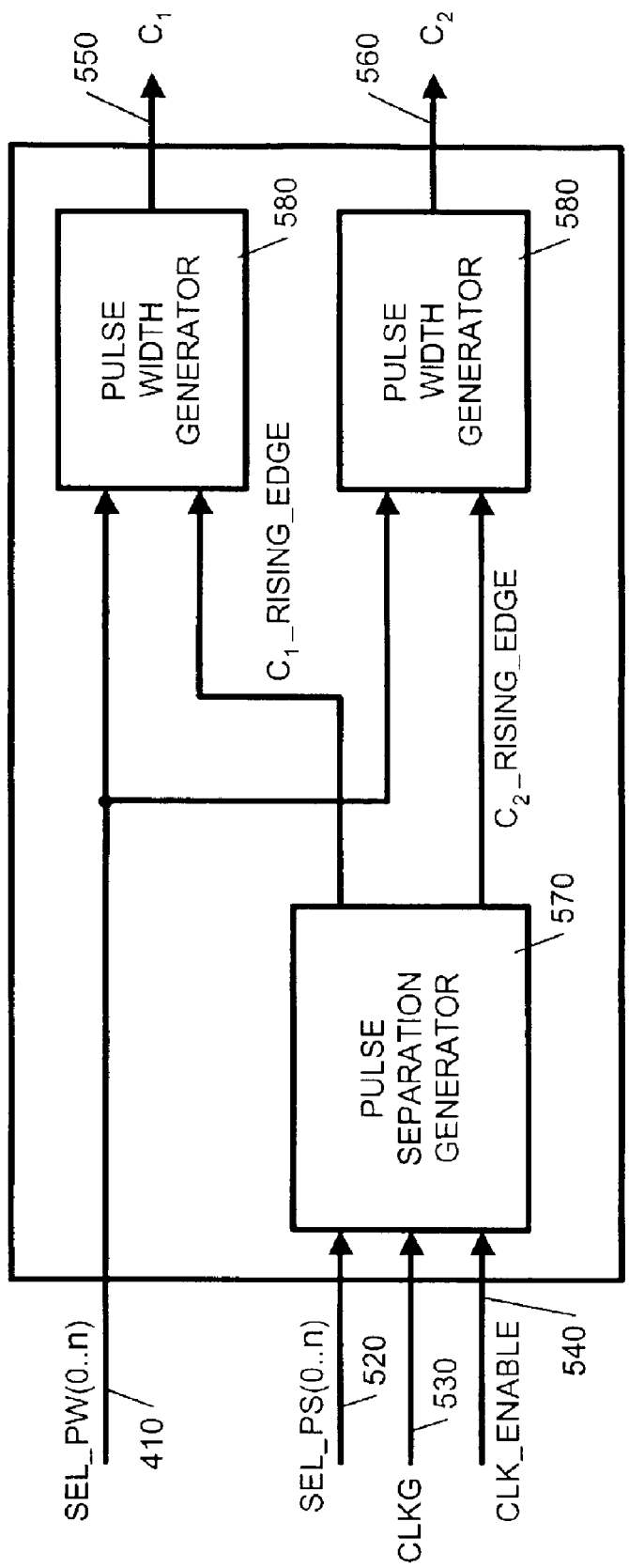
FIG. 5 is more detailed diagram of the variable pulse width and pulse separation clock generator of the present invention.

FIG. 5 is a more detailed diagram of the variable pulse width and pulse separation clock generator of the present invention. Again, the variable pulse width and pulse separation clock generator has four inputs and two outputs. The variable pulse width and pulse separation clock generator also has a pulse separation generator 570 and two pulse width generators 580. The pulse separation signal receives at input 520 (i.e., SEL_PW(0 . . . n) is fed into the pulse separation generator 570. The global clock signal clkg and the clock enable signal clk_enable are also fed to the pulse separation generator 570 through inputs 530 and 540, respectively.

The pulse separation generator 570 has two outputs that define each a rising edge of a pulse (e.g., clock pulses $C_1$ and $C_2$). Each one of the two output signals of the pulse separation generator 570 is used as one of two input signals of the two pulse width generators 580. The other input signal of the two pulse width generators 580 is the pulse width selector signal from input 510 (i.e., SEL_PW(0 . . . n)). The two pulse width generators 580 have each one output, the clock signals $C_1$ 550 and $C_2$ 560. Note that signals $C_1$ and $C_2$ do not have to be of equal pulse widths. Indeed, in many cases, the two signals will not have the same pulse width.

Figure 6:
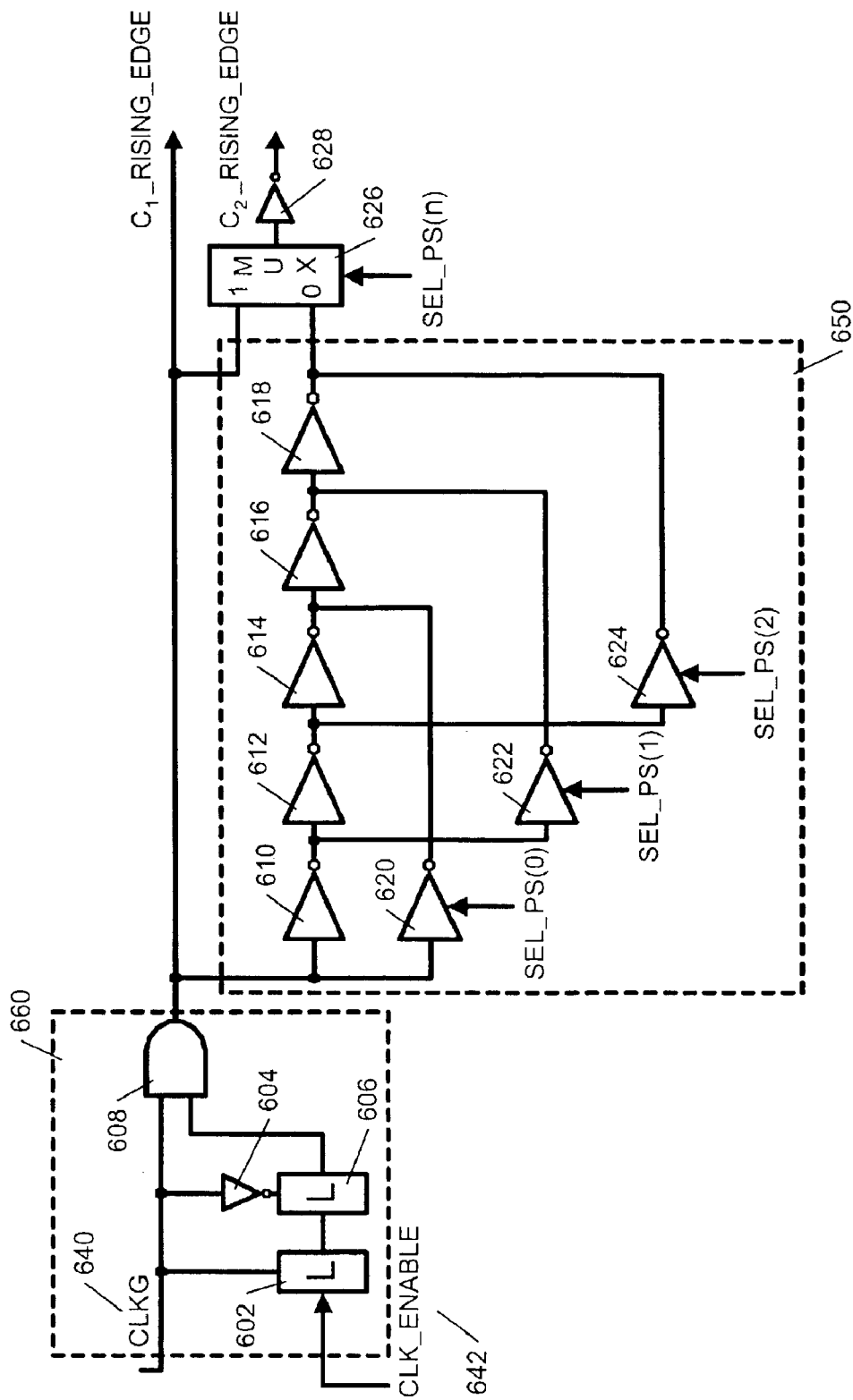
FIG. 6 is a detailed diagram of a pulse separation generator.

FIG. 6 is a detailed diagram of the pulse separation generator 570. The pulse separation generator has a glitch avoidance circuit 660 and a delaying circuit 650. The glitch avoidance circuit 660 has two latches (latches 602 and 606), an inverter 604 and an AND-gate 608. As shown, the global clock signal clkg 640 and the clock enable signal clk_enable 642 are used as inputs to the glitch avoidance circuit 660. The clock enable signal clk_enable 642 is latched by latch 602 when the global clock signal is high. When the clock signal is low, the latch 606 latches the data (i.e., the clock enable signal) at the output of the latch 602. When both the clock enable signal 642 at the output of latch 606 and the global clock signal are high, the output of the AND-gate 608 becomes high. Thereby the clock enable signal 642 and global clock signal 640 are synchronized without glitches.

The instant the output of the AND-gate 608 becomes high, the edge of the pulse of the clock signal $C_1$ is risen. However, unlike the rising edge of the pulse of the clock signal $C_1$, which occurs as soon as the output of the AND-gate 608 becomes high, the rising edge of the pulse of the signal $C_2$ may be delayed until the output of the AND-gate 608 is transitioned to a low signal or until an additional amount of time has elapsed after the output of the AND-gate 608 has transitioned to the low signal.

The additional amount of time by which the rising edge of the signal $C_2$ may further be delayed depends upon inputs received by the delaying circuit 650. For example, if the delaying circuit 650 is not wired to receive any of the signals SEL_PS(0), SEL_PS(1) and SEL_PS (2), the rising edge of the clock signal $C_2$ will be delayed by the time it takes for the clock signal to propagate through inverters 610, 612, 614, 616 and 618. If each inverter delays the clock signal by 20 picoseconds, for example, the rising edge of the pulse of the signal $C_2$ will be additionally delayed by 100 picoseconds.

If when using one of the signals SEL_PS(0), SEL_PS(1) and SEL_PS(2), the delay is reduced by 10 picoseconds, then when SEL_PS(0) is used to energize inverter 620, the rising edge of the signal $C_2$ will instead be delayed by 90 picoseconds. If SEL_PS(1) which energizes inverter 622 or SEL_PS(2) which energizes inverter 624 is used in conjunction with SEL_PS(0), then the rising edge of $C_2$ will instead be delayed by 80 picoseconds. If all three SEL_PS (0), (1) and (2) are used, then the rising edge of $C_2$ will instead be delayed by 70 picoseconds.

PS_SEL(n) is used to either select or bypass the delaying circuit 650. For example, when PS_SEL(n) is a logical one (1), the multiplexer 626 will directly select the output of the AND-gate 608, bypassing the delaying circuit 650. Due to inverter 628, therefore, the rising edge of the pulse of the signal $C_2$ will occur as soon as the output of the AND-gate 608 transitions to a low signal. When PS_SEL(n) is a logical zero (0), the output of the delaying circuit 650 will be selected. Thus, the rising edge of the signal $C_2$ will be additionally delayed in accordance with the delay introduced by the delaying circuit 650.

Figure 7:
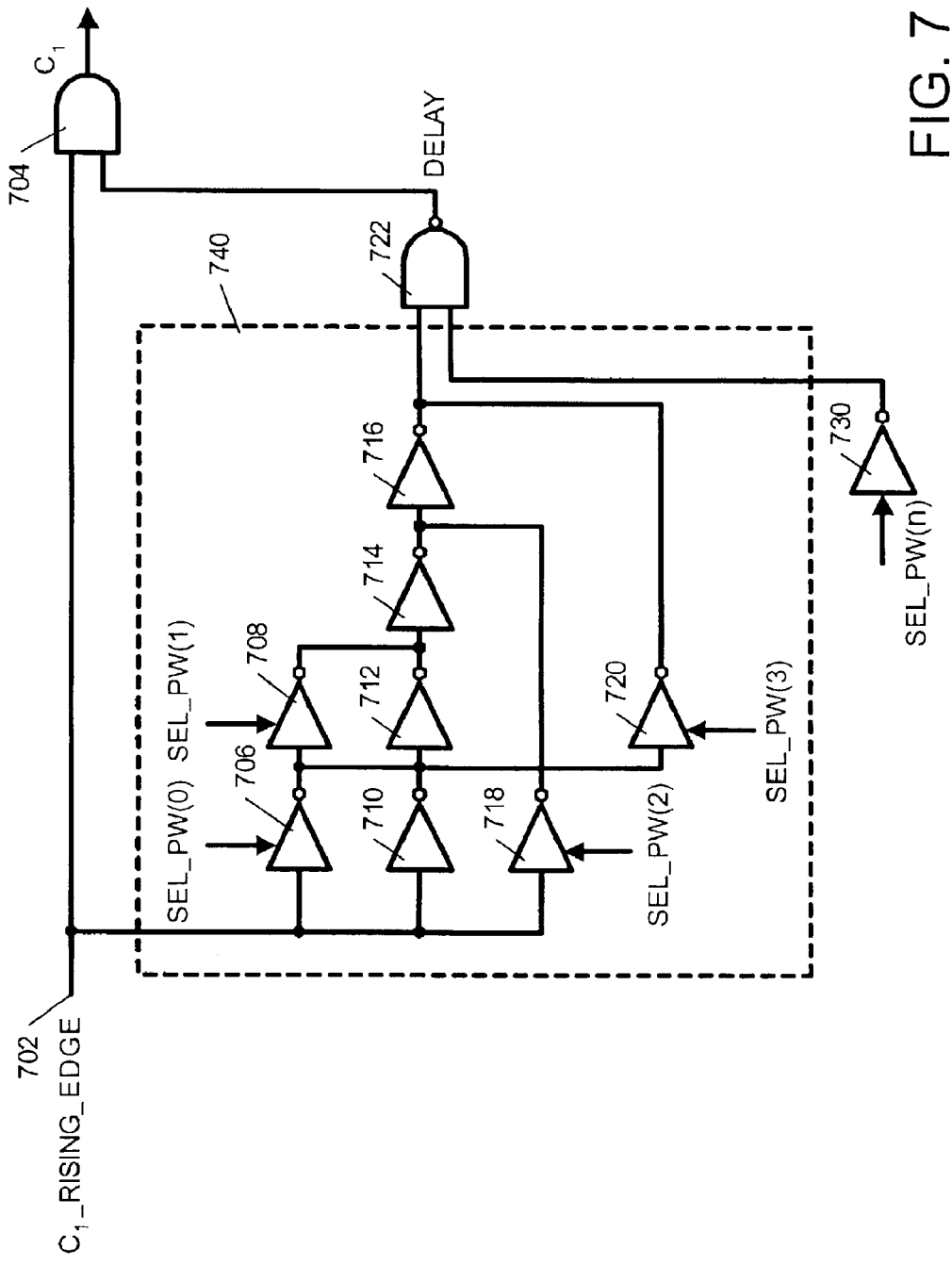
FIG. 7 is a detailed diagram of a pulse width generator.

FIG. 7 is a detailed diagram of one of the two pulse width generators 580. The two pulse width generators 580 are identical except that one receives the signal defined by the $C_1$_rising_edge signal as input and outputs the $C_1$ signal while the other receives the signal defined by the $C_2$_rising_edge signal as input and outputs the $C_2$ signal (see FIG. 5). Therefore, to simplify the disclosure of the invention only one of the two pulse width generators (i.e., the one receiving the $C_1$_rising_edge signal) will be used to explain the invention.

The pulse width generator 580 receives the $C_1$_rising_edge signal at input 702. This signal is used as one of two inputs to an AND-gate 704. The other input is a delayed version of the $C_1$_rising_edge signal. The output of the AND-gate 704 is clock signal $C_1$.

The pulse width generator 580 includes a delaying circuit 740 to delay the signal $C_1$_rising_edge. In delaying the signal, a plurality of inverters is used (i.e., inverters 706, 708, 710, 712, 714, 716, 718 and 720). When none of the signals SEL_PW(0), SEL_PW(1), SEL_PW(2) and SEL_PW(3) is used, the signal receives at input 702 is delayed by the inverters 710, 712, 714 and 716. If each inverter delays the signal by 20 picoseconds, upon arriving at NAND-gate 722, the signal will be delayed by a total of 80 picoseconds.

As before, if when an inverter is energized, the delay is reduced by 10 picoseconds, then when SEL_PW(2) or SEL_PW(3) is used to energize inverter 718 or inverter 720, respectively, the total delay will be reduced by 10 picoseconds. If both were to be used simultaneously, the delay may be reduced by a total of 20 picoseconds.

When inverters 706 and/or 708 is energized by SEL_PW(0) and/or SEL_PW(1), respectively, the delay may be reduced by an additional 2 picoseconds, for example, for a total of 12 picoseconds. This is because inverter 706 is wired in parallel with inverter 710. This then provides a lower effective resistance to the current flowing from the input of the two inverters to their output. The same analogy is true for inverter 708, which is in parallel with inverter 712. Consequently, if all the inputs SEL_PW(0), SEL_PW(1), SEL_PW(2) and SEL_PW(3) are used in conjunction with each other, the delay may be reduced to 36 picoseconds.

Signal SEL_PW(n) is used to either enable or bypass delaying circuit 740. For example, when SEL_PW(n) is a logical zero (0), the input to the NAND-gate 722 from inverter 730 becomes a logical one (1). Thus, the output of the NAND-gate 722 will remain a logical one (1) until the input to the NAND-gate 722 from inverter 716 becomes a logical one (1) (i.e., until the delayed signal has reached the NAND gate 722). So long as the output of the NAND-gate 722 remains a logical one, the output of the AND-gate 704 will be a logical one (1) provided that the signal received at input 702 continues to be a logical one (1). Hence, when the signal defined by the $C_1$_rising_edge signal is received, the output of the AND-gate 704, which represents the pulse of the signal $C_1$, will be high. When that signal has propagated through the appropriate number of inverters and reached the NAND-gate 722, the output of the NAND-gate will transition to a low signal, ending the pulse.

When SEL_PW(n) is a logical one (1), the input to the NAND-gate 722 from inverter 730 becomes a logical zero (0). Then, whether or not the delayed signal reaches the NAND-gate 722, the output of the NAND-gate 722 will be a logical one (1). Hence, the output of the AND-gate 704 will be a logical one (1) so long as the signal received at input 702 remains a logical one (1). Consequently, the duration of the pulse signal $C_1$ will be equal to the duration of the pulse of the clocking signal received at input 702.

One of the advantages of the clocking mechanism of the present invention is very low clock skew. Clock skew is the difference in time between simultaneous clock transitions within a system. Clock skew reduces circuit performance by introducing race conditions and hold time problems. Race conditions occur when a latch designed to maintain a data signal at a particular level for sampling by a circuit in a second clock zone transitions prior to the sampling event. Hold time problems occur when delays in a data transmission circuit reduce the time available for a data signal to be reliably sampled in a receiving circuit. In the present invention, since the two clock signals, $C_1$ and $C_2$, are generated locally from a single clock signal, very low skew is introduced. A very low skew avoids two problems associated with clock signal $C_2$. First, if $C_2$ arrives too early, the wrong data is latched. Second, if a skew causes $C_2$ to arrive too late, the output is late for the succeeding logic stage.

Figure 8:
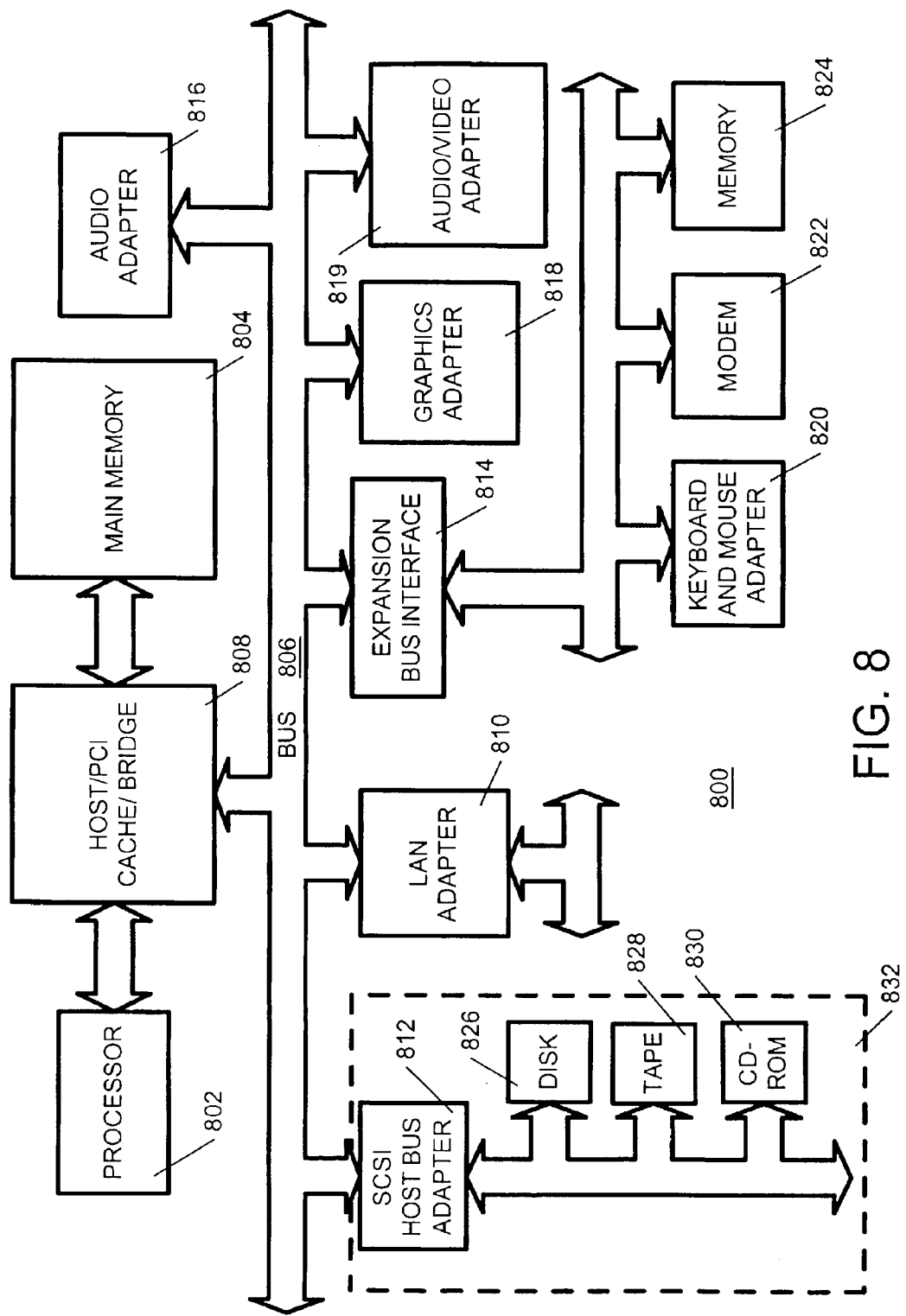
FIG. 8 is a block diagram of a data processing system in which the invention may be implemented.

FIG. 8 is a block diagram of a data processing system in which the invention may be implemented. Data processing system 800 employs a peripheral component interconnect (PCI) local bus architecture. Although the depicted example employs a PCI bus, other bus architectures such as Accelerated Graphics Port (AGP) and Industry Standard Architecture (ISA) may be used. Processor 802 and main memory 804 are connected to PCI local bus 806 through PCI bridge 808. PCI bridge 808 also may include an integrated memory controller and cache memory for processor 802. Additional connections to PCI local bus 806 may be made through direct component interconnection or through add-in boards. In the depicted example, local area network (LAN) adapter 810, SCSI host bus adapter 812, and expansion bus interface 814 are connected to PCI local bus 806 by direct component connection. In contrast, audio adapter 816, graphics adapter 818, and audio/video adapter 819 are connected to PCI local bus 806 by add-in boards inserted into expansion slots. Expansion bus interface 814 provides a connection for a keyboard and mouse adapter 820, modem 822, and additional memory 824. Small computer system interface (SCSI) host bus adapter 812 provides a connection for hard disk drive 826, tape drive 828, and CD-ROM drive 830. Typical PCI local bus implementations will support three or four PCI expansion slots or add-in connectors.

An operating system runs on processor 802 and is used to coordinate and provide control of various components within data processing system 800 in FIG. 8. The operating system may be a commercially available operating system, such as Windows XP, which is available from Microsoft Corporation. An object oriented programming system such as Java may run in conjunction with the operating system and provide calls to the operating system from Java programs or applications executing on data processing system 800. "Java" is a trademark of Sun Microsystems, Inc. Instructions for the operating system, the object-oriented operating system, and applications or programs are located on storage devices, such as hard disk drive 826, and may be loaded into main memory 804 for execution by processor 802.

Those of ordinary skill in the art will appreciate that the hardware in FIG. 8 may vary depending on the implementation. Other internal hardware or peripheral devices, such as flash ROM (or equivalent nonvolatile memory) or optical disk drives and the like, may be used in addition to or in place of the hardware depicted in FIG. 8. Also, the processes of the present invention may be applied to a multiprocessor data processing system.

The depicted example in FIG. 8 is not meant to imply architectural limitations. For example, data processing system 800 may also be a notebook computer or hand held computer. Data processing system 800 also may be a kiosk or a Web appliance. In any case, the invention may be stored in any memory device employed by the data processing system 800.

The description of the present invention has been presented for purposes of illustration and description, and is not intended to be exhaustive or limited to the invention in the form disclosed. Many modifications and variations will be apparent to those of ordinary skill in the art. For example, more than two pulses may be used. Further, the number of inverters in both the pulse separation generator 510 and the pulse width generator 580 may vary. Thus, the embodiment was chosen and described in order to best explain the principles of the invention, the practical application, and to enable others of ordinary skill in the art to understand the invention for various embodiments with various modifications as are suited to the particular use contemplated.

What is claimed is:

1. A clock generator comprising:
   at least one input for receiving a clock signal having a rising and a falling edge;
   means for selectably delaying a rising edge of a pulse signal synchronized to the falling edge of the clock signal;
   first selectable duration pulse synchronized to the rising edge of the clock signal; and
   second selectable duration pulse synchronized to the selectably delayed rising edge.

2. The clock generator of claim 1 further comprising a glitch avoidance circuit coupled to the at least one input for generating a glitchless clock signal.

3. The clock generator of claim 2 wherein the selectably delaying means includes a plurality of delaying elements, each element introducing an amount of delay.

4. The clock generator of claim 3 further comprising means for selectively reducing the amount of delay introduced by the elements.

5. The clock generator of claim 4 further comprising an input for selectively bypassing the delaying means.

6. An apparatus for providing low skew clock signals comprising:
   at least one input for receiving a clock signal having a rising and a falling edge;
   a glitch avoidance circuit for removing glitches in the clock signal;
   means for selectably delaying a rising edge of a pulse signal synchronized to the falling edge of the glitchless clock signal;
   first selectable duration pulse synchronized to the rising edge of the glitchless clock signal; and
   second selectable duration pulse synchronized to the selectably delayed rising edge.

7. The apparatus of claim 6 wherein the selectably delaying means includes a plurality of delaying elements, each element introducing an amount of delay.

8. The apparatus of claim 7 further comprising means for selectively reducing the amount of delay introduced by the elements.

9. The apparatus of claim 8 further comprising an input for selectively bypassing the delaying means.

* * * * *